United States Patent
Chien et al.

(10) Patent No.: US 11,199,574 B2
(45) Date of Patent: Dec. 14, 2021

(54) DEVICE AND METHOD FOR TESTING RECEPTACLE WIRING

(71) Applicant: PEACEFUL THRIVING ENTERPRISE CO., LTD., Changhua County (TW)

(72) Inventors: Shih-Hsiang Chien, Changhua County (TW); Mu-Tsan Yu, Changhua County (TW)

(73) Assignee: PEACEFUL THRIVING ENTERPRISE CO., LTD., Changhua County (TW)

( * ) Notice: Subject to any disclaimer, the term of this patent is extended or adjusted under 35 U.S.C. 154(b) by 166 days.

(21) Appl. No.: 16/595,487

(22) Filed: Oct. 8, 2019

(65) Prior Publication Data
US 2021/0102994 A1    Apr. 8, 2021

(51) Int. Cl.
*G01R 31/28*        (2006.01)
*G01R 31/50*        (2020.01)

(52) U.S. Cl.
CPC ......... *G01R 31/2841* (2013.01); *G01R 31/50* (2020.01)

(58) Field of Classification Search
CPC .... G01R 31/28; G01R 31/2841; G01R 31/50; G01R 31/52; G01R 31/67; G01R 31/69
See application file for complete search history.

(56) References Cited

U.S. PATENT DOCUMENTS

| | | | |
|---|---|---|---|
| 2002/0101231 A1* | 8/2002 | Staats | G01R 15/142 324/126 |
| 2005/0212526 A1* | 9/2005 | Blades | G01R 31/58 324/543 |
| 2007/0063688 A1* | 3/2007 | Nguyen | G01R 31/086 324/67 |

* cited by examiner

*Primary Examiner* — Son T Le
(74) *Attorney, Agent, or Firm* — Raymond Y. Chan; David and Raymond Patent Firm

(57) ABSTRACT

A device and a method for testing receptacle wiring are revealed. The device for testing receptacle wiring includes a signal transmitter and a receiver. The signal transmitted is plugged into a receptacle to be tested while the receiver is used to detect voltage signals of no-fuse breakers (NFB) and receive signals from the signal transmitter so as to find out correspondence between the NFB and the receptacle correctly.

3 Claims, 4 Drawing Sheets

DEVICE AND METHOD FOR TESTING RECEPTACLE WIRING

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to a device and a method for testing receptacle wiring, and more particular to a device and a method for testing receptacles that search circuit signals between a plurality of receptacles and a plurality of no fuse breakers (NFB) electrically connected to the receptacles correspondingly so as to find out the position of the no fuse breaker corresponding to the receptacle under test.

Description of Related Arts

Generally, the most common way for electrical technicians to perform power distribution maintenance of outlets or wires is to shut off no fuse breakers manually and then use an voltmeter to measure whether there is voltage in an outlet. However, such method is obviously not efficient. Thus, there are several receptacle wiring testers available on the market now, such as the device revealed in U.S. Pat. No. 8,599,029.

An electrical circuit identification means is revealed. The electrical circuit identification device includes a signal generator and a signal receiver. The single generator sends signals into wires after being plugged into a live socket. Then the signal receiver receives various waves from the signal generator and turns the waves into digital signals. The digital signals are cross checked and compared with the preset data. Thereby the position of the circuit breaker connected correspondingly to the socket under test for control of the socket circuit can be found out correctly.

The conventional receptacle wiring tester checks wires through combinations of signal generators and signal receivers and whether the target is found out is commonly indicated by light or sounds. The signal strength (level) is shown by at least one LED light lit up or the volume level of the buzzer.

However, when there is a plurality of sockets electrically connected to and corresponding to a plurality of circuit breakers disposed adjacent to one another, the conventional receptacle wiring tester is unable to find out which one of the circuit breaker adjacent to one another is the corresponding circuit breaker connected to the receptacle under test. This is because that the voltage signals of the adjacent circuit breakers have similar values and it's difficult to distinguish the at least two voltage signals with little difference. For better distinction, more indicator lights having more levels or liquid crystal display (LCD) can be used. Yet the product with such design needs larger volume and higher cost. Moreover, power consumption is another problem for handheld devices. Thus, there is a room for improvement and there is a need to provide a novel receptacle wiring tester in which a general test mode and advanced comparison mode are provided and switched for checking the wiring quickly and accurately.

SUMMARY OF THE PRESENT INVENTION

Therefore, it is a primary object of the present invention to provide a device and a method for testing receptacle wiring, which are used to find out the no fuse break (NFB) corresponding to the circuit of the receptacle under test in a more advanced way.

In order to achieve the above object, a method for testing receptacle wiring according to the present invention includes the following steps. A plurality of signal values with similar strength is obtained in the general mode. Then the no fuse breakers (NFBs) with similar signal strength are tested again. The first one signal value detected and defined as initial signal value is saved. Next the signal strength of the respective NFB is compared with the initial value by a microcontroller. After several times of comparison, the initial signal value with weaker strength is removed and the position of a target NFB with the strongest signal is found out.

In order to achieve the above object, a device for testing receptacle wiring according to the present invention includes a signal transmitter and a receiver. The signal transmitter is used for being connected to receptacles and sending signals related to the receptacle while the receiver is used to detect voltage of no fuse breakers (NFBs) and search voltage signals from the signal transmitter for identification of the position correspondence and electrical connection between the receptacles and the NFBs. The signal transmitter sends signals to the NFB and the receiver searches the signals. The receiver is provided with a general mode and a comparison mode switchable therebetween for advanced testing. The values of the voltage signals can be compared more accurately in the advanced comparison mode.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

Figure 1:
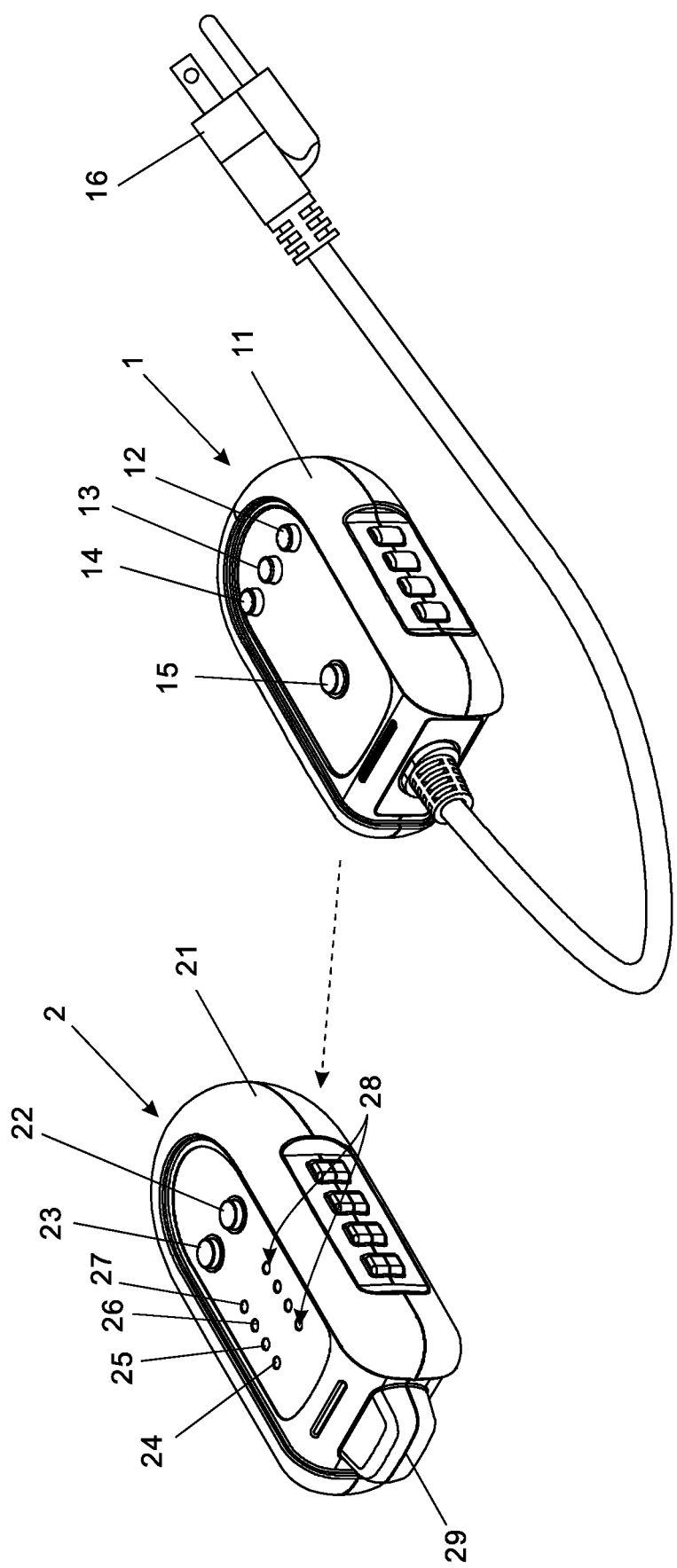
FIG. 1 is a perspective view of a preferred embodiment according to the present invention.

Referring to FIG. 1, a device for testing receptacle wiring according to the present invention includes a signal transmitter 1 and a receiver 2. The signal transmitter 1 consists of a first housing 11 with an operating panel thereon, a button input unit 15 and a plurality of receptacle wiring indication units 12, 13, and 14 disposed on the operating panel of the first housing 11, and a plug 16 arranged at a wire extended from the first housing 11. A first circuit board is built in the first housing 11 and electrical circuit of the first circuit board is connected to the button input unit 15 (such as GFCI (Ground Fault Circuit Interrupter) Button) and a plurality of receptacle wiring indication units 12, 13, and 14 and a wire. One end of the wire is connected to the plug 16. The receiver 2 is composed of a second housing 21, a power on/off button 22, a function switch button 23, a power-on light 24, a NFB light 25, a NCV light 26, a signal light 27, a plurality of sensing strength lights 28 and a sensing end 29. The power on/off button 22, the function switch button 23, the power-on light 24, the NFB light, the NCV light, the signal light 27, and the sensing strength lights 28 are arranged at an operating panel on the second housing 21. The power on/off button 22 is used to control the power status, on or off. The function switch button 23 is used for switching modes among NCV general searching mode, NFB general searching mode, and NFB comparison mode. The signal light 27 shows the signal strength sensed. The sensing strength light 28 adjusts the strength of the signal sensed for signal gain. The signal transmitter 1 sends signals to the receiver 2 correspondingly while the receiver 2 receives the signal from the signal transmitter 1 through the receptacle to the no fuse breaker (NFB) 4 of a breaker panel. The signal transmitter 1 is used to not only test whether ground fault circuit interrupters (GFCI) work normally and whether wiring of the receptacles 3 is correct but also send signals to the no fuse breakers (NFB) 4, allowing the receiver 2 to search the signals. The receiver (wire tracer) 2 is used to test non-contact voltage (NCV mode) and search signals from the signal transmitter (NFB mode) for identifying position correspondence between the receptacle 3 and the NFB 4 correctly.

The signal transmitter 1 sends signals to the NFBs 4 through the receptacle 3 being tested so that the receiver 2 can find out and locate the NFB 4 connected to the receptacle 3 tested. Moreover, the button input unit 15 test whether the Ground Fault Circuit Interrupter (GFCI)) can shut off the circuit/power properly if there is a fault or a leakage current.

A testing method is as follows. The plug 16 of the signal transmitter 1 is plugged into the GFCI receptacle 3. Then push the button input unit 15 (such as GFCI button) of the signal transmitter 1 and check whether the GFCI goes to the "trip" position properly.

The receiver 2 is mainly used for checking signal strength of the signals being transmitted from the signal transmitter 1 to the NFB 4 through the receptacle 3 and finding out circuit between the receptacle 3 and the NFB 4 correctly. This is the NFB mode of the device. Another function of the receiver 2 is for detecting Non-Contact Voltage (NCV) signal, working as non-contact voltage test pens and this is the NCV mode.

The first circuit board of the signal transmitter 1 is composed of an AC Input and Signal Output Unit which is a 3pin connection unit being connected to the receptacle 3 by a plug, the button input unit 15 (such as GFCI button input unit), a tester and signal transmitter unit (such as GFCI tester and signal transmitter unit) and the receptacle wiring indication units 12, 13 and 14. The 3pin connection unit which include L (live), GND (ground) and N (neutral) wires can be connected directly to the circuit board by the plug 16 or a set of wires of the plug 16. The button input unit 15 is a push button on/off circuit used for generating a path for Earth Leakage Current. The tester and signal transmitter unit includes a circuit for generating resistance to earth leakage current and tester. The receptacle wiring indication unit 12, 13 or 14 is a unit which uses lights or voice prompts for indicating the status.

In the testing method of the receptacle 3 mentioned above, whether the receptacle 3 wiring is correct can be learned by the lighting of the receptacle wiring indication unit 12, 13 and 14.

Figure 2:
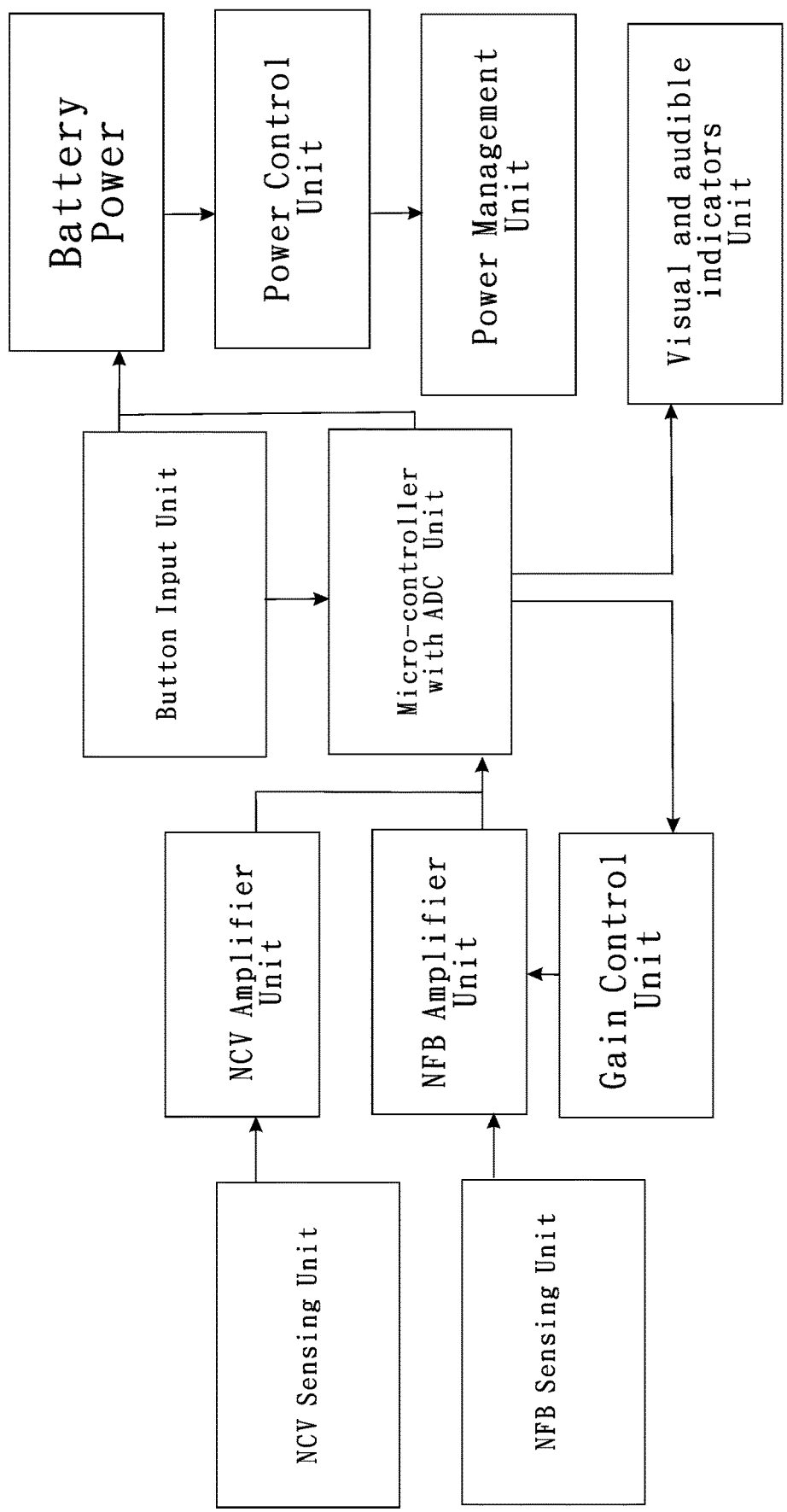
FIG. 2 is a circuit diagram on a circuit board of a receiver of a preferred embodiment according to the present invention.

As shown in FIG. 2, a circuit on a circuit board of the receiver 2 includes a NCV sensing unit, a NCV amplifier unit, a NFB sensing unit, a NFB amplifier unit, a gain control unit, a micro-controller with ADC Unit, a battery power, a power control unit, and a recognizable visual and audible indicator unit. The NCV sensing unit includes a signal sensor for detecting signals derived from live wires. The NCV amplifier unit composed of a signal amplifier and a signal conditioner is used for amplification, shaping and filtering of weak signals received by the NCV sensing unit. The NFB sensing unit is provided with a sensor used for detecting and receiving signals from the signal transmitter. The NFB amplifier unit having a signal amplifier and a signal conditioner is used for amplification, shaping and filtering of weak signals received. As to the gain control unit, it is used for gain control of the NFB amplifier unit. The amplitude of the signal being amplified can be changed by gain control for being applied to conditions at different occasions. The micro-controller with ADC unit is a micro-controller with I/O, Flash Memory, RAM, and ADC therein and used for control of a power control unit, reading signals from the NFB sensing unit and the NCV sensing unit for performing identification and computation, reading signals from a button input unit to switch functions, and controlling signal strength indication and identification. Through the buttons and the micro-controller with ADC unit, the power control unit controls the battery power entering the power management unit for supplying power required to all circuits.

After pick-up by the NCV sensing unit, the signals are amplified and conditioned by the signal amplifier circuit and signal conditioner circuit in the NCV amplifier unit. Then the signals are sent to the micro-controller with ADC unit to be converted from analogue forms to digital forms by an analog-to-digital converter (ADC) in the micro-controller. Next the signal level is checked by the program so as to change flashing frequency and brightness of the LED as well as audio-frequency and the volume level of the buzzer by the recognizable visual and audible indicator unit. Users can learn the level of the signal strength through the difference of the light or the sounds and further find out the position of the wire with the strongest signal or check whether the wire is having the voltage signals for testing whether the wiring of the receptacle 3 is live.

In order to test whether the receptacle operates normally, the signal transmitter 1 is plugged into the receptacle 3. If the wiring of the receptacle 3 delivers power normally, users can learn whether the power is properly connected through the receptacle wiring indication units 12, 13 and 14 of the signal transmitter 1.

Once the signal transmitter 1 is connected to the receptacle 3, the lights on the signal transmitter 1 come on to show the state of the wiring. If the state is normal, users can start use the receiver 2 for searching the breaker panel.

The sensing end 29 of the receiver 2 is in contact with the NFB 4 for performing searching.

During the searching, the strength of the signal is shown by flashing speed of the signal light 27. The signal is stronger when the signal light 27 flashes faster with higher brightness, even always on. At the same time, the signal strength can also be represented by audio-frequency of the buzzer. The higher the audio frequency, the stronger the signal. While in use, the number of the sensing strength lights 28 lit-up can be controlled by pressing the power switch. The fewer lights lit-up, the weaker the sensing strength. The more lights on, the stronger the sensing strength. In the beginning, only one of the sensing strength lights 28 is on. After searching all of the NFBs 4, the rest of the sensing strength lights 28 are turned on one by one for increasing the sensing strength if there is no obvious difference in flash strength of the signal light 27. Then perform searching of all of the NFBs 4 again until the correct NFB 4 is found out.

While in use, a method for testing receptacle wiring includes the following steps.

1. Plug the signal transmitter 1 to the circuit of the receptacle 3. A load current is supplied to the signal transmitter 1 from an AC power source synchronously with AC signals so that signal changes occur on the whole AC line of the receptacle 3. The current signal is collected and amplified by the sensors of the receiver 2. Then the position of the corresponding NFB 4 can be found out through the measurement.

2. The operation of the receiver 2: press the power on/off button 22 so that the power-on light 24 is lit up and the power is on. After the initialization and automatic calibration being completed, the function switch button 23 is pressed to switch from NFB mode to the NCV mode and the NCV light 26 is on. Then the sensing end 29 in front of the receiver 2 is getting closer to the NFB 4 for detecting if it's on. The test results are shown by the flashing frequency of the signal light 27 as well as the audio-frequency and the volume level of the buzzer.

In the general searching mode, the test method includes the following steps.

1. Plug the plug 16 of the signal transmitter 1 into the receptacle 3.

2. Long press the power on/off button 22 of the receiver 2 to turn on the power of the receiver 2. After the power-on, the power-on light 24 is lit up. Then initial calibration and automatic calibration are performed and completed in turn and the NFB light 25 is on at the moment, representing it's the NFB mode. Press the power on/off button 22 quickly so that the micro-controller with ADC unit controls the gain control unit and the NFB amplifier unit is further changed for changing amplifier gain. Now one of the sensing strength lights 28 is on and the sensing strength is at the first stage for searching the NFB 4 with stronger signal strength. In this embodiment, there is a 5-stage gain so that there are five sensing strength lights 28. When only one sensing strength light 28 is lit up, this is the first stage and able to be applied to the NFB 4 having strong signals within a short distance. Then the rest of the sensing strength lights 28 are lit up in turn in order to increase the gain and amplify the signals for searching the NFB 4 with weak signals. The gain adjustment is performed by pressing the power on/off button 22 quickly. Now the NFB 4 is tested in the general mode. The sensing end 29 of the receiver 2 is in contact with a plurality of NFBs 4 to be tested. The NFB 4 which makes the signal light 27 have the fastest flashing during the contact is just the correct one corresponding to the receptacle 3 under test.

The NFB mode includes two working modes—NFB general searching mode and NFB comparison mode. The function switch button 23 is used for switching between the general searching mode and the comparison mode. In some breaker panels with HW-type breaker boxes, the strength of the voltage signal of the NFBs 4 derived from the same live wire may be very similar (the signal may acts on the branch of the same live wire simultaneously). Thus, the signal strength is unable to be differentiated through one light and buzzer. Lastly there are still two or three NFBs 4 with similar signal strength and it's difficult to find out the position correspondence between the receptacles 3 and the NFBs 4 correctly. Thus, the advanced searching is carried out in the NFB comparison mode.

The present invention features on the comparison mode being applied to the condition that the signal strength of most of the NFBs 4 is similar and the user is unable to find out which one of the NFBs 4 is corresponding to the receptacle 3 to be tested.

Figure 3:
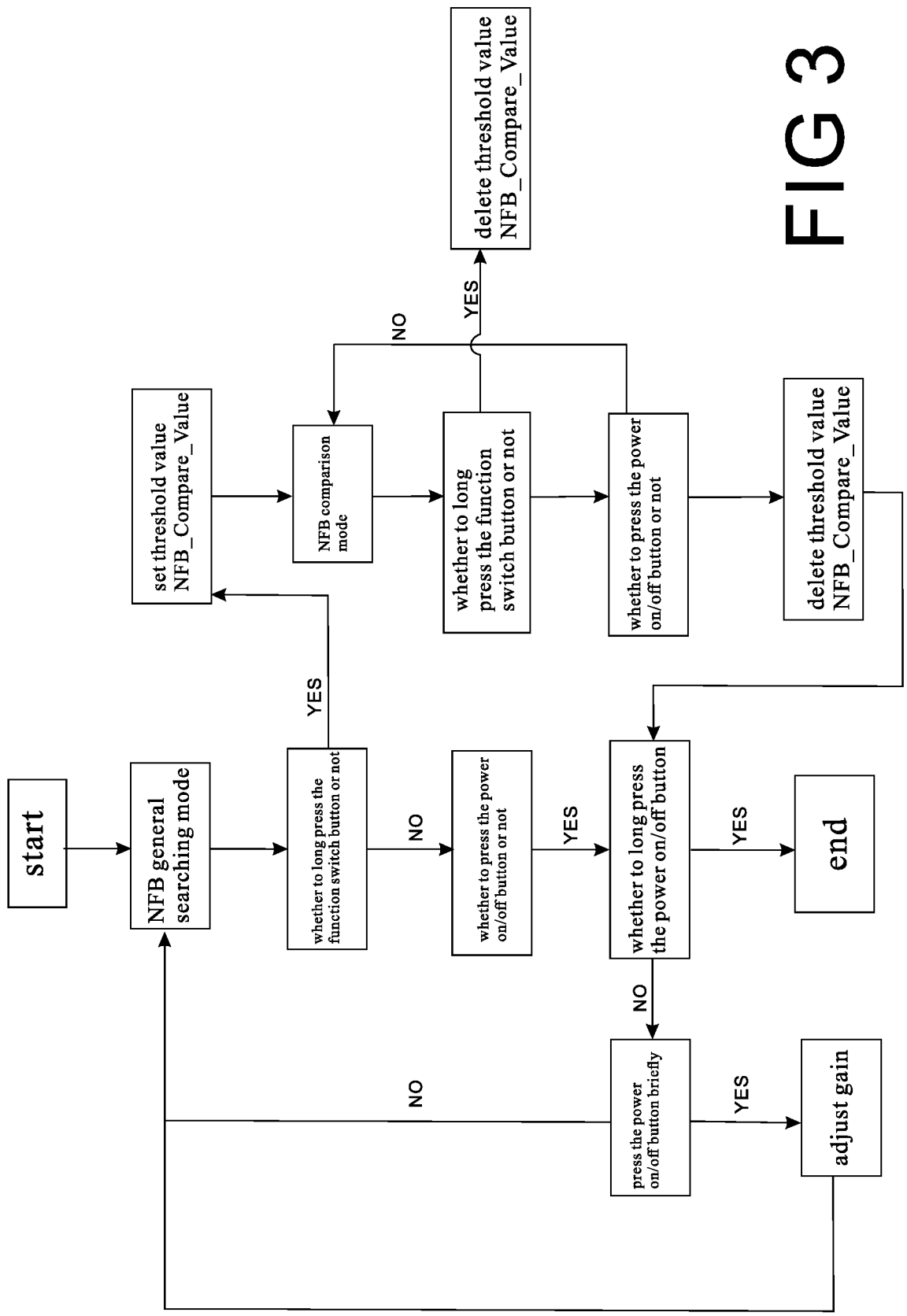
FIG. 3 is a process flow diagram of a comparison mode of a preferred embodiment according to the present invention.
Figure 4:
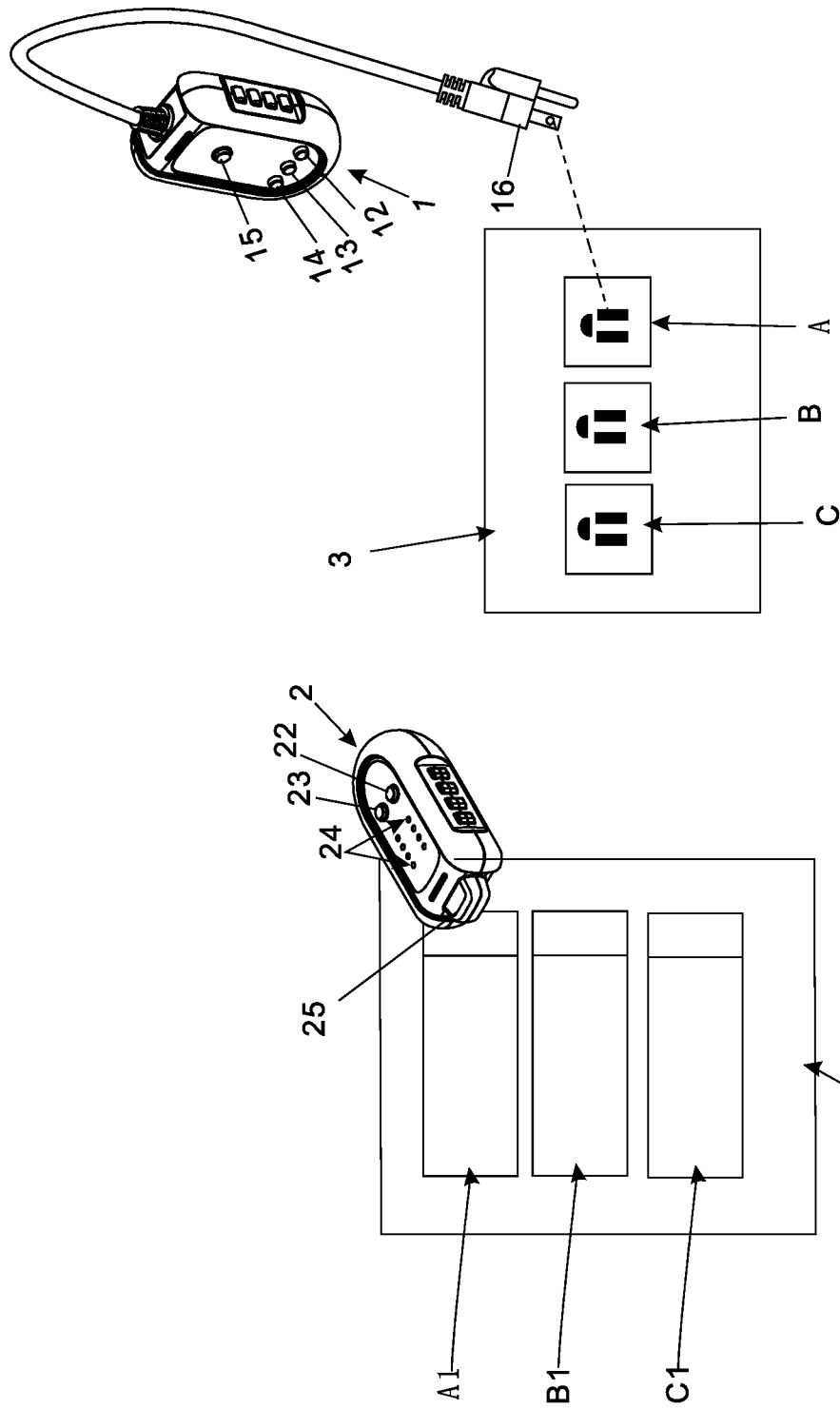
FIG. 4 is a schematic drawing showing a preferred embodiment in use according to the present invention.

Referring to FIG. 3 and FIG. 4, the test method in the comparison mode includes the following steps.

1. First perform the above steps in the general mode to get a plurality of NFBs 4 with similar signal strength.

2. Then test the NFBs 4 with similar signal strength in the comparison mode. The sensing end 29 of the receiver 2 touches one of the NFBs 4 with similar signal strength again and click the function switch button 23 so that the NFB light 25 is on in a flashing manner and the receiver 2 is switched to the comparison mode. In the comparison mode, the signal value of the NFB 4 firstly detected is saved for further comparison with the signal value of the rest of the NFBs. After being detected, the signal values of the rest of the NFBs 4 are obtained and compared with the saved signal value of the NFB 4 firstly detected. Thereby the NFB 4 with the strongest signal is found out and this NFB 4 is the correct one corresponding to the receptacle 3 under test.

3. After pick-up by the NFB sensing unit, the signals are amplified and conditioned by the signal amplifier circuit and the signal conditioner circuit in the NFB amplifier unit, and the gain control unit. Then the signals are sent to the micro-controller with ADC unit to be converted from analogue forms to digital forms by an analog-to-digital converter (ADC) in the micro-controller. Next the signal level is checked by the program and the first signal value detected is saved. The signal value saved is compared with other similar signal values for a more accurate comparison of signal strength. The flashing frequency and brightness of the signal light 27 and the audio-frequency and volume level of the buzzer are further changed and controlled respectively for checking signal level to find out the position of the NFB 4 with the strongest signal.

As shown in FIG. 4, there are three sets of receptacles 3 and NFBs 4 corresponding to each other in this embodiment. The three NFBs 4 including NFB A1, NFB B1, and NFB C1 have similar signals and their positions are quite close to one another. The position of the NFB 4 with the strongest signal among the three NFBs A1, B1 and C1 is unable to be identified in the general mode. Now the receiver 2 is aligned with the NFB A1 statically for several seconds. Then long press the function switch button 23 so that the receiver 2 is switched to the NFB comparison mode. In the NFB comparison mode, the strength value of the NFB A1 at the moment is saved as and the NFB light starts blinking. Then perform the comparative search on the NFB B1 and the NFB C1. If the strength value of the signal obtained is larger than the NFB_Compare_Value, the buzzer gives continuous fast and short beeps and the signal light 27 flashes so fast that it almost looks like a solid light. Once the signal of the NFB B1 is stronger than that of the NFB A1, the strength value of the NFB A1 originally saved can be removed. Then long press the function switch button 23 again for returning to the general search mode and comparing the NFB B1 with the NFB C1. Select one of the rest of the NFBs B1 and C1 for saving the signal strength value. For example, the sensing end 29 of the receiver 2 stays at the NFB B1 for several seconds and the signal light 27 blinks. At the moment, long press the function switch button 23 and save strength value of the NFB B1 as the NFB_Compare_Value. Then move the sensing end 29 of the receiver 2 to the other NFB C1 for comparison. If the signal of the NFB C1 measured is stronger than that of the NFB B1, the buzzer gives continuous fast and short beeps and the signal light 27 blinks so fast that it almost looks like a solid light. If not, both the buzzer and the signal light 27 will not react. Thus, the NFB 4 with the strongest signal can be located in the comparison mode.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalent.

What is claimed is:

1. A device for testing receptacle wiring comprising:
a signal transmitter used for being connected to a receptacle under test and sending signals related to the receptacle under test; and
a receiver which detects voltage of no fuse breakers (NFBs) and searches voltage signals from the signal transmitter for identification of position correspondence and electrical connection between the receptacles and the NFBs;
wherein the signal transmitter sends signals to the NFBs, allowing the receiver to search the signals; the receiver provides a general mode and a comparison mode switchable therebetween for advanced testing; values of the voltage signals are able to be compared more accurately in the comparison mode;
wherein circuitry on a circuit board of the receiver includes a non-contact voltage sensing unit with a signal sensor which detects signals radiated from live wires, a non-contact voltage amplifier unit having a signal amplifier and a signal conditioner and used for amplification, shaping and filtering of weak signals received by the sensing unit, a NFB sensing unit is provided with a sensor used for detecting and receiving signals from the signal transmitter, a NFB amplifier unit provided with a signal amplifier and a signal conditioner and used for amplification, shaping and filtering of weak signals received, a gain control unit for gain control of the NFB amplifier unit and further changing amplitude of the signal amplified to be applied to conditions at different occasions, a micro-controller with ADC unit at different occasions, a micro-controller with ADC unit which is a micro-controller with I/O, Flash Memory, RAM, and ADC therein and used for control of a power control unit, reading signals from the NFB sensing unit and the non-contact voltage sensing unit for performing automatic calibration, reading signals from a button input unit to switch functions, and controlling signal strength indication and identification, a battery power, the power control unit that controls the battery power entering power management unit for supplying power required to all circuits, and a recognizable visual and audible indicator unit.

2. A device for testing receptacle wiring comprising:
a signal transmitter used for being connected to a receptacle under test and sending signals related to the receptacle under test; and
a receiver which detects voltage of no fuse breakers (NFBs) and searches voltage signals from the signal transmitter for identification of position correspondence and electrical connection between the receptacles and the NFBs;
wherein the signal transmitter sends signals to the NFBs, allowing the receiver to search the signals; the receiver provides a general mode and a comparison mode switchable therebetween for advanced testing; value of the voltage signals are able to be compared more accurately in the comparison mode;
wherein how the device is switchable between the general mode and the comparison mode for advanced testing is as follows; a plurality of NFBs with similar signal strength is detected and selected in the general mode first; then the NFBs with similar signal strength are tested in the comparison mode; a sensing end of the receiver is in contact with one of the NFBs with similar signal strength again to get a first signal value; and the function switch button is clicked so that the NFB light is flashing, representing the receiver is switched to the comparison mode; the first signal value of the NFB tested in the general mode is saved for advanced comparison with signal values of the rest of the NFBs; once the comparison mode is activated, the signal values of the rest of the NFBs detected are compared with the first signal value saved; the NFB which makes the signal light have the fastest flashing and even always on is the correct NFB corresponding to the receptacle under test.

3. A method for testing receptacle wiring, comprising steps of:
detecting and selecting a plurality of NFBs with similar signal strength in a general mode;
testing the plurality of NFBs with similar signal strength in a comparison mode;
getting a first signal value through a sensing end of a receiver being in contact with one of the plurality of NFBs with similar signal strength again;
saving the first signal value of the one of the plurality of NFBs tested in the general mode for advanced comparison with signal values of other NFBs of the plurality of NFBs;
comparing the signal values of the other NFBs of the plurality of NFBs detected with the first signal value saved, once the comparison mode is activated;
finding out the NFB with a strongest signal;
picking up signals by a NFB sensing unit and then amplifying and conditioning the signal by a signal amplifier circuit and a signal conditioner circuit in a NFB amplifier unit and a gain control unit;
sending the signals amplified and conditioned to a micro-controller with ADC unit for being converted from analogue forms to digital forms by an analog-to-digital converter in the micro-controller;
checking level of the signals by a program, saving the first signal value detected and comparing the signal value saved first with other similar signal values for a more accurate comparison of signal strength; and
changing flashing frequency and brightness of at least one signal light as well as audio frequency and volume of at least one buzzer for checking signal level, and finding out position of the no-fuse breaker with the strongest signal.

* * * * *